United States Patent
Chediak et al.

(10) Patent No.: US 6,946,376 B2
(45) Date of Patent: Sep. 20, 2005

(54) SYMMETRIC DEVICE WITH CONTACTS SELF ALIGNED TO GATE

(75) Inventors: Juan A. Chediak, Berkeley, CA (US); Randy W. Mann, Jericho, VT (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/173,950

(22) Filed: Jun. 17, 2002

(65) Prior Publication Data

US 2002/0158286 A1 Oct. 31, 2002

Related U.S. Application Data

(62) Division of application No. 09/500,361, filed on Feb. 8, 2000, now Pat. No. 6,445,050.

(51) Int. Cl.$^7$ ............................................ H01L 21/336
(52) U.S. Cl. ........................ 438/586; 438/197; 438/595
(58) Field of Search ............................... 438/197, 585, 438/586, 592, 595

(56) References Cited

U.S. PATENT DOCUMENTS

| | | | |
|---|---|---|---|
| 4,272,881 A | | 6/1981 | Angle |
| 4,517,729 A | | 5/1985 | Batra |
| 4,703,551 A | * | 11/1987 | Szluk et al. ................ 438/220 |
| 4,780,429 A | * | 10/1988 | Roche et al. ............... 438/237 |
| 4,795,718 A | * | 1/1989 | Beitman ..................... 438/297 |
| 5,043,790 A | | 8/1991 | Butler |
| 5,286,667 A | | 2/1994 | Lin et al. |
| 5,393,704 A | | 2/1995 | Huang et al. |
| 5,422,289 A | * | 6/1995 | Pierce ........................ 438/287 |
| 5,773,331 A | | 6/1998 | Solomon et al. |
| 5,804,846 A | | 9/1998 | Fuller |
| 5,849,622 A | | 12/1998 | Hause et al. |
| 5,885,895 A | | 3/1999 | Liu et al. |
| 5,905,293 A | | 5/1999 | Jeng et al. |
| 5,920,098 A | | 7/1999 | Liaw |
| 5,920,780 A | | 7/1999 | Wu |

(Continued)

FOREIGN PATENT DOCUMENTS

| | | |
|---|---|---|
| JP | 9-260655 | 10/1997 |
| JP | 11-26757 | 1/1999 |
| JP | 11-177089 | 7/1999 |

Primary Examiner—Tom Thomas
Assistant Examiner—N. Drew Richards
(74) Attorney, Agent, or Firm—Schmeiser, Olsen & Watts; William Sabo

(57) ABSTRACT

A method of forming conductive contacts to drain and source regions of a semiconductor device such as a field effect transistor (FET). A gate structure is formed over a portion of a semiconductor substrate, wherein the gate structure includes: a gate dielectric on a surface of the semiconductor substrate, a conductive gate aligned on the gate dielectric, a silicide layer aligned on the conductive gate, and a silicon nitride cap aligned on the silicide layer. Insulative spacers are formed on sidewalls of the gate structure, and the insulative spacers contact the semiconductor substrate. A drain region and a source region are formed within the semiconductor substrate, wherein a channel region is disposed between the drain region and the source region, and wherein the gate structure is over the channel region. After an insulative region containing a photosensitive material, such as boro-phoso-silicate glass, is formed over the gate structure and the semiconductor substrate, a cavity over the drain region and a cavity over the source region are formed photolithographically. The cavities are filled with conductive material such as tungsten, forming a conductive contact to the drain region and a conductive contact to the source region. The top surfaces of the conductive contacts and the top surface of the gate structure are coplanar.

10 Claims, 7 Drawing Sheets

U.S. PATENT DOCUMENTS

| | | |
|---|---|---|
| 5,926,702 A | 7/1999 | Kwon et al. |
| 5,950,090 A * | 9/1999 | Chen et al. ................. 438/296 |
| 5,976,930 A * | 11/1999 | Noble ........................ 438/253 |
| 6,124,192 A * | 9/2000 | Jeng et al. .................. 438/597 |
| 6,130,121 A * | 10/2000 | Sze ............................. 438/167 |
| 6,180,453 B1 * | 1/2001 | Sung et al. ................. 438/256 |
| 6,387,759 B1 * | 5/2002 | Park et al. .................. 438/275 |

* cited by examiner

SYMMETRIC DEVICE WITH CONTACTS SELF ALIGNED TO GATE

This application is a divisional of Ser. No. 09/500,361, filed on Feb. 8, 2000 U.S. Pat. No. 6,44,5050.

BACKGROUND OF THE INVENTION

1. Technical Field

The present invention relates to a method of forming a conductive stud self-aligned to a gate structure of a semiconductor device (e.g., a field effect transistor), wherein the conductive stud is conductively coupled to a drain region, or a source region, of the semiconductor device.

2. Related Art

Operation of a semiconductor device (e.g., a field effect transistor) that has a gate structure over a channel that is disposed between a drain and a source, requires conductive contacts (e.g., conductive studs) which conductively contact the drain and the source, such that the conductive contacts are insulatively separated from each other. In order to improve performance of the semiconductor device, gate structures are becoming smaller in size and this trend is expected to continue. As gate structure size diminishes, however, reliably aligning the conductive contacts with respect to the gate structure becomes increasingly difficult due to limited availability of space into which the conductive contacts may be positioned. As a result, conductive contacts may be placed in such close proximity of each other that undesired electrical shorting may occur.

A method is needed for positioning conductive contacts with respect to a gate structure, such that there is little risk of electrical shorting between the conductive contacts.

SUMMARY OF THE INVENTION

The present invention provides a first method of fabricating semiconductor device, comprising the steps of:

providing a semiconductor substrate;

forming a gate structure, including:

forming a gate dielectric on a surface of the semiconductor substrate; and forming a conductive gate aligned on the gate dielectric;

forming a drain region within the semiconductor substrate;

forming a source region within the semiconductor substrate, wherein a channel region is disposed between the drain region and the source region, and wherein the gate dielectric is over the channel region;

forming a first insulative spacer on a first sidewall of the gate structure;

forming a second insulative spacer on a second sidewall of the gate structure;

forming a first conductive stud in contact with the first insulative spacer, and in electrical contact with the drain region, wherein the first conductive stud includes a first conductive material; and forming a second conductive stud in contact with the second insulative spacer, and in electrical contact with the source region, wherein the second conductive stud includes a second conductive material, and wherein a surface of the first conductive stud, a surface of the second conductive stud, and a surface of the gate structure are coplanar.

The present invention provides a first semiconductor device, comprising:

a semiconductor substrate having a drain region, a source region, and a channel region disposed between the drain region and the source region;

a gate structure on the semiconductor substrate, said gate structure including:

a gate dielectric on a portion of the channel region; and a conductive gate aligned on the gate dielectric;

a first insulative spacer on a first sidewall of the gate structure;

a second insulative spacer on a second sidewall of the gate structure;

a first conductive stud in contact with the first insulative spacer, and in electrical contact with the drain region, wherein the first conductive stud includes a first conductive material; and a second conductive stud in contact with the second insulative spacer, and in electrical contact with the source region, wherein the second conductive stud includes a second conductive material, and wherein a surface of the first conductive stud, a surface of the second conductive stud, and a surface of the gate structure are coplanar.

The present invention provides a method of fabricating semiconductor device, comprising the steps of:

providing a semiconductor substrate;

forming a gate structure, including:

forming a gate dielectric on a surface of the semiconductor substrate; and forming a conductive gate aligned on the gate dielectric;

forming a drain region within the semiconductor substrate;

forming a source region within the semiconductor substrate, wherein a channel region is disposed between the drain region and the source region, and wherein the gate dielectric is over the channel region;

forming an insulative spacer on a sidewall of the gate structure; and forming a conductive stud in contact with the insulative spacer, and in electrical contact with a diffusion region selected from the group consisting of the drain region and the source region, wherein the conductive stud includes a conductive material.

The present invention provides a semiconductor device, comprising:

a semiconductor substrate having a drain region, a source region, and a channel region disposed between the drain region and the source region;

a gate structure on the semiconductor substrate, said gate structure including:

a gate dielectric on a portion of the channel region; and a conductive gate aligned on the gate dielectric;

an insulative spacer on a sidewall of the gate structure;

a conductive stud in contact with the insulative spacer, and in electrical contact with a diffusion region selected from the group consisting of the drain region and the source region, wherein the conductive stud includes a conductive material.

The present invention has the advantage of positioning conductive contacts with respect to a gate structure, such that there is little risk of electrical shorting between the conductive contacts.

The present invention has the advantage of offering substantial flexibility in spatially distributing conductive contacts, and also in spatially distributing conductive posts on the conductive contacts, so as to permit formation of a large variety of conductive pathways to the drain and the source.

DETAILED DESCRIPTION OF THE INVENTION

Figure 1:
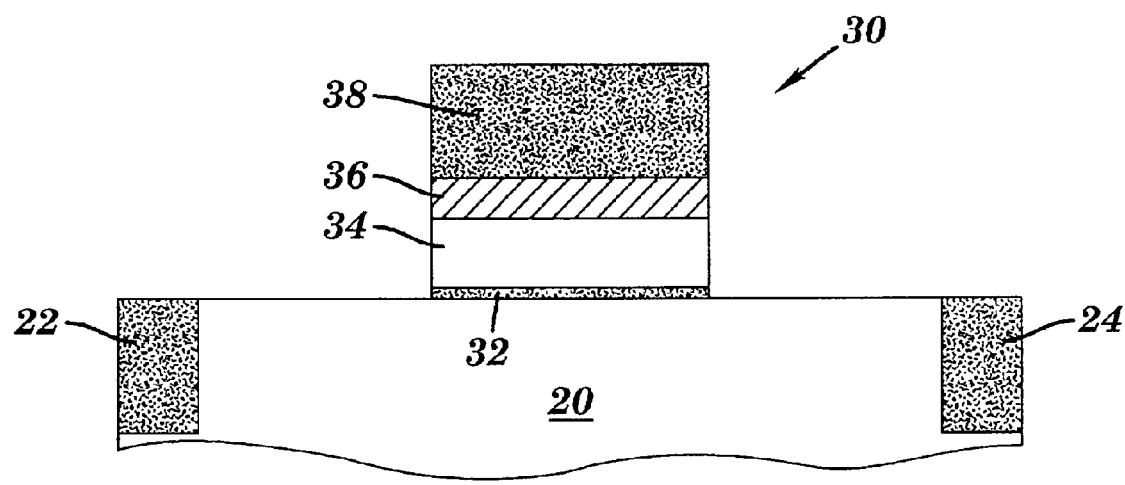
FIG. 1 depicts a front cross-sectional view of a gate structure on a semiconductor substrate, in accordance with preferred embodiments of the present invention.
Figure 9:
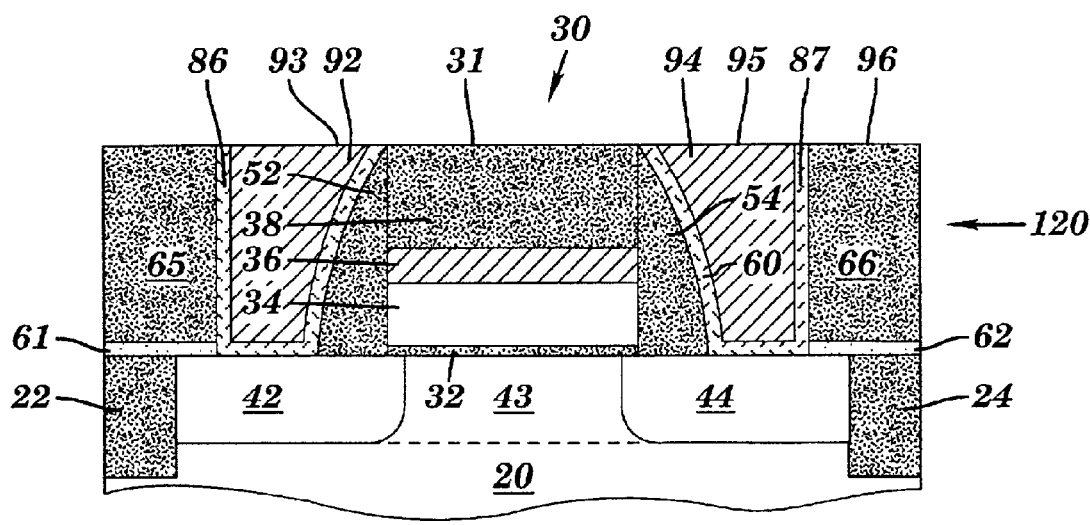
FIG. 9 depicts FIG. 8 after conductive material has filled the cavities to form conductive studs.

FIG. 1 illustrates a front cross-sectional view of a gate structure 30 on a semiconductor substrate 20, in accordance with preferred embodiments of the present invention. The semiconductor substrate 20 includes a semiconductor material such as silicon. The gate structure 30 comprises: a gate dielectric 32 including an electrically insulative dielectric material, a conductive gate 34 aligned on the gate dielectric 32, a silicide layer 36 aligned on the conductive gate 34, and an insulative cap 38 aligned on the silicide layer 36. The conductive gate 34 includes any metal, metal alloy, or doped semi-conductor. The conductive gate 34 preferably includes polysilicon. The silicide layer 36, which is a preferable but not mandatory component of the gate structure 30, includes a silicide, such as tungsten silicide, that has a much lower sheet resistance than does the conductive gate 34. Noting that the gate electrode of the gate structure 30 includes the conductive gate 34, the silicide layer 36 serves to lower the overall sheet resistance of the gate electrode, since the silicide layer 36 is in a parallel combination with the conductive gate 34. The insulative cap 38 includes an electrically insulative material such as silicon nitride which serves to prevent electrical shorting between the gate structure 30 (i.e., the conductive gate 34 or the silicide layer 36 of the gate structure 30) and conductive studs 92 and 94 (to be formed subsequently as shown in FIG. 9). The insulative cap 38 also functions as an etch stop and a polish stop in etching and polishing steps to be described infra. The semiconductor substrate 20 may also include a small trench isolation (STI) 22 and an STI 24 for providing electrically insulative separation between geometric portions of the semiconductor substrate 20.

Figure 2:
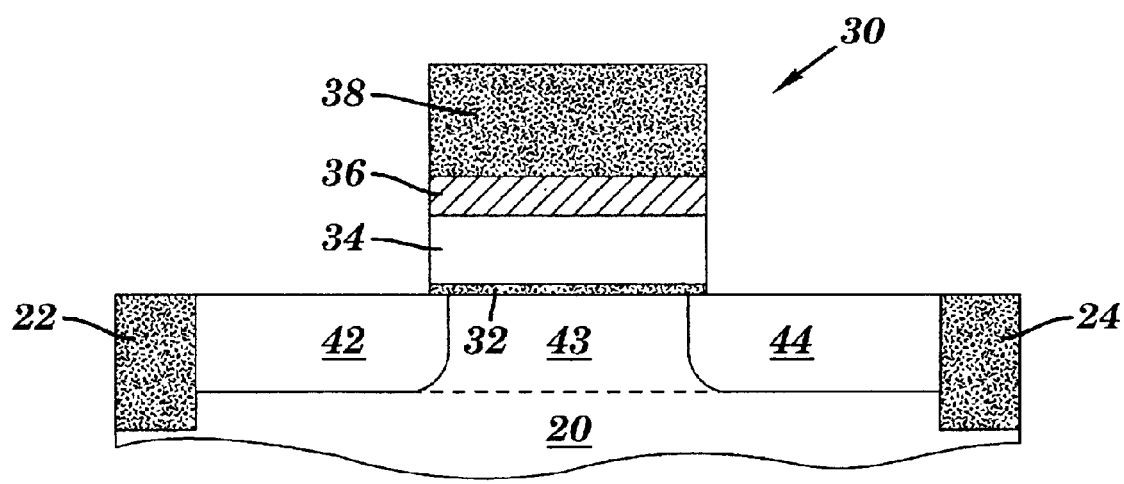
FIG. 2 depicts FIG. 1 after a drain region and a source region have been formed in the semiconductor substrate.

FIG. 2 illustrates FIG. 1 after a drain region 42 and a source region 44 have been formed in the semiconductor substrate 20, such as, inter alia, by any ion implantation technique known to one of ordinary skill in the art, such that a channel region 43 is disposed between the drain region 42 and the source region 44. The drain region 42 may be insulatively separated from other portions of the semiconductor substrate 20 by the STI 22. Similarly, the source region 44 may be insulatively separated from other portions of the semiconductor substrate 20 by the STI 24. A possible configuration includes: the drain region 42 containing N+material, the channel region 43 containing P−material, and the source region 44 containing N+material. Another possible configuration includes: the drain region 42 containing P+material, the channel region 43 containing N−material, and the source region 44 containing P+material.

Figure 3:
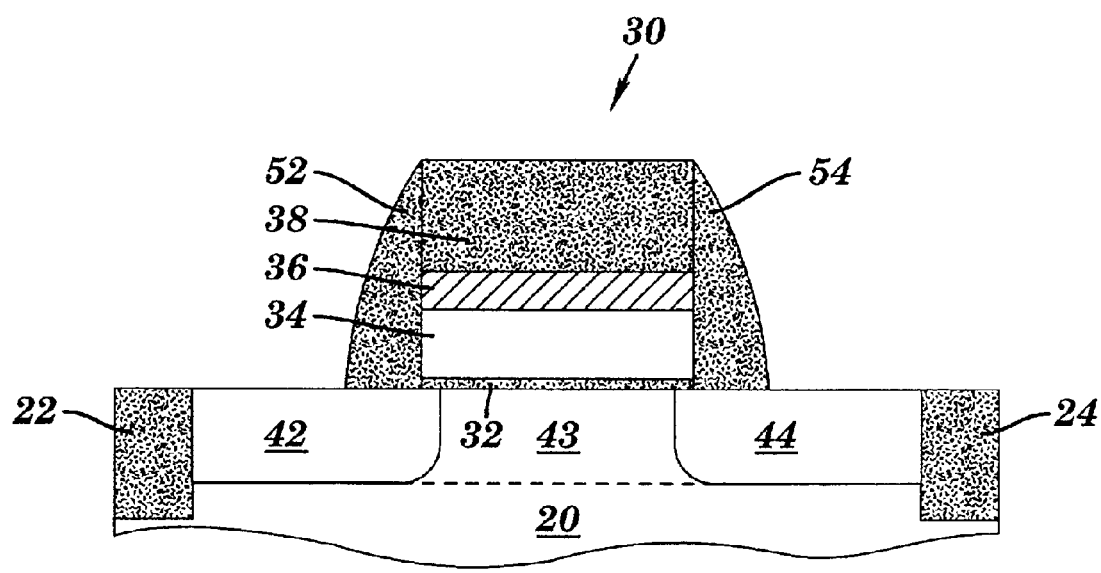
FIG. 3 depicts FIG. 2 after insulative spacers have been formed abutting the gate structure.

FIG. 3 illustrates FIG. 2 after insulative spacers 52 and 54 have been formed abutting the gate structure 30. The insulative spacers 52 and 54 include insulative material, such as a nitride, that serves to prevent electrical shorting between the gate structure 30 (i.e., the conductive gate 34 or the silicide layer 36 of the gate structure 30) and conductive studs 92 and 94 (to be formed subsequently as shown in FIG. 9). While FIG. 3 shows formation of the insulative spacers 52 and 54 after the drain region 42 and the source region 44 have been previously formed (as shown in FIG. 2), drain region 42 and the source region 44 could alternatively be formed after the insulative spacers 52 and 54 have been formed.

Figure 4:
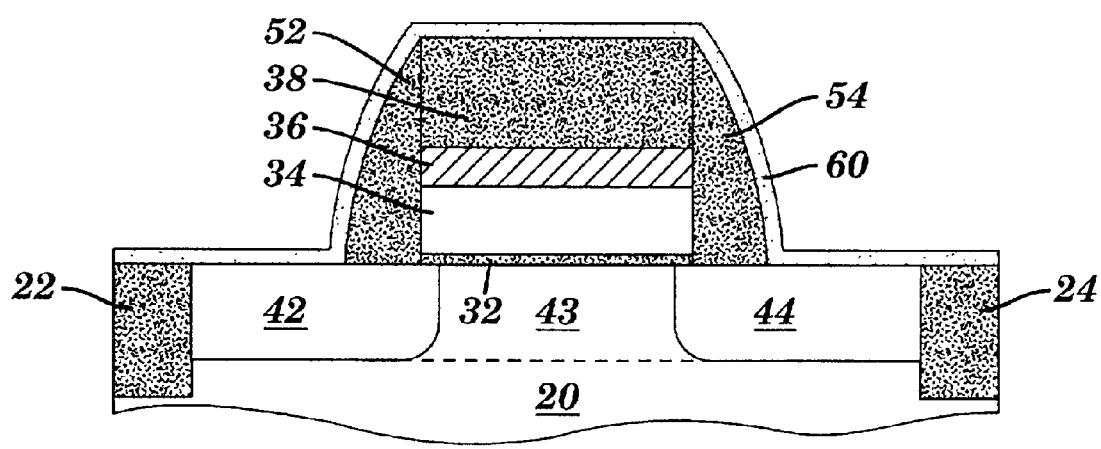
FIG. 4 depicts FIG. 3 after a nitride blanket has been formed over the gate structure, the insulative spacers, and exposed portions of the source region and drain region.

FIG. 4 illustrates FIG. 3 after a nitride blanket 60 has been formed over: the gate structure 30, the insulative spacers 52 and 54, an exposed surface of the drain region 42, and an exposed surface of the source region 44. The nitride blanket 60, which is preferred but not mandatory, may include, inter alia, silicon nitride. The nitride blanket 60 serves as an ionic barrier to ions, such as sodium and potassium ions, which will be present during the subsequent chemical mechanical polishing (CMP) that will be described infra in relation to FIG. 5. The nitride blanket 60 also serves as an etch stop to protect against etching the semiconductor substrate 20 and etching the insulative spacers 52 and 54, in relation to the etching process described infra in conjunction with FIG. 7.

Figure 5:
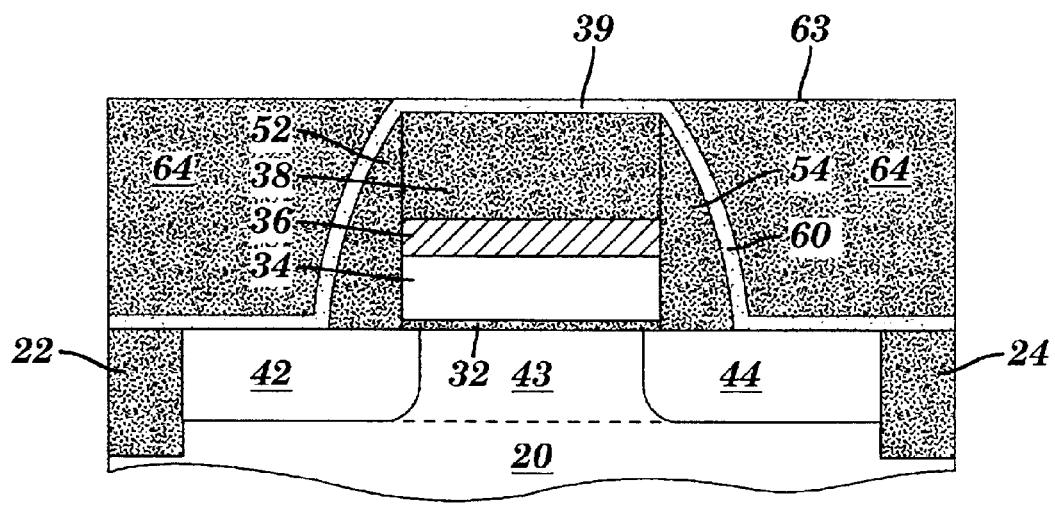
FIG. 5 depicts FIG. 4 after an insulative region (IR) has been formed on the nitride blanket.

FIG. 5 illustrates FIG. 4 after an insulative region (IR) 64 has been formed on the nitride blanket 60. The IR 64, which preferably includes a boro-phoso-silicate glass (BPSG), serves to define boundaries of an electrically conductive path through conductive studs formed as described in conjunction with FIG. 9. The IR 64 comprises material that can be directionally etched away after its top surface 63 has been masked to selectively receive a directional etchant. Accordingly, portions of the IR 64 will be subsequently directionally etched away to form cavities into which conductive material will be inserted to generate the conductive studs of the present invention, as will be described infra in conjunction with FIGS. 6, 7, 8, and 9.

Returning to FIG. 5, the IR 64 is initially formed on the nitride blanket 60 to be above a top surface 39 of the nitride blanket 60. After the initial IR 64 formation, the IR 64 is planarized by any method known to one of ordinary skill in the art, such as by chemical mechanical polishing (CMP), resulting in the top surface 63 of the IR 64 that is coplanar with a portion 39 of the top surface of the nitride blanket 60, said portion 39 being above the insulative cap 38.

Figure 6:
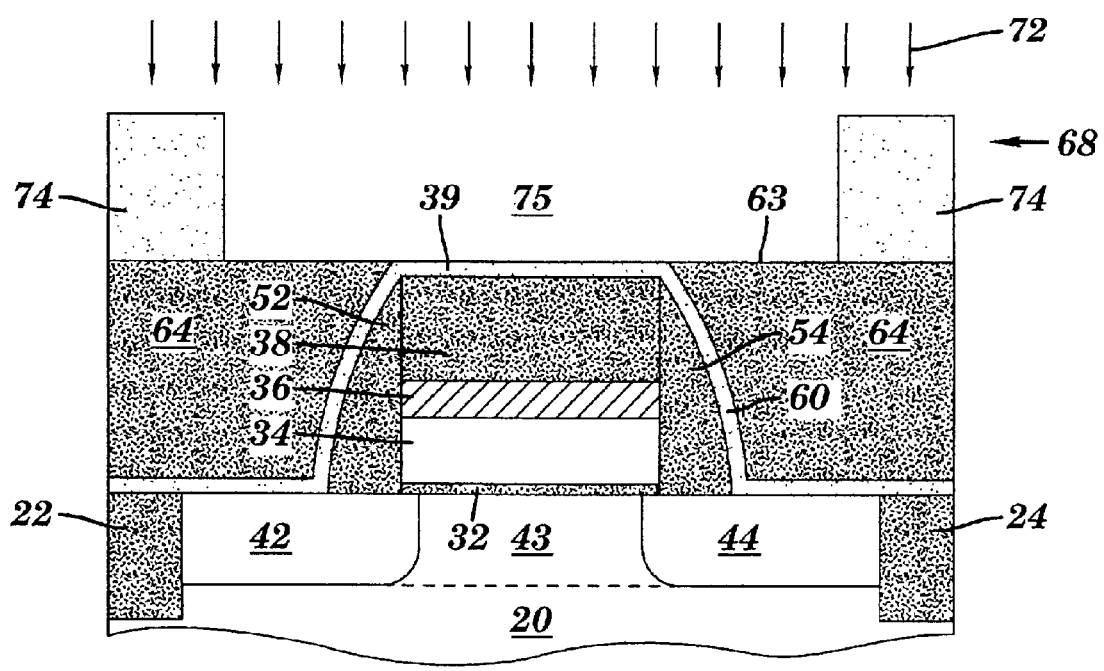
FIG. 6 depicts FIG. 5 after a mask pattern has been formed on the IR and a directional etchant has been directed onto the IR.

FIG. 6 illustrates FIG. 5 after a mask pattern 68 has been formed on the IR 64, leaving exposed portions of the IR 64 over the nitride blanket 60, the first insulative spacer 52, the second insulative spacer 54, the drain region 42, and the source region 44. The mask pattern 68 includes an etchant-blocking portion 74 and a void portion 75. Thus, the mask pattern 68 masks the top surface 63 of the IR 64 such that a portion of the top surface 63 of the IR 64, including the portion 39 of the top surface of the nitride blanket 60, is exposed. The mask pattern 68 may be formed by any method known to one of ordinary skill in the art. Starting with FIG. 5, for example, the mask pattern 68 may be formed by: patterning a photoresist on the top surface 63 of the IR 64, exposing the photoresist to radiation, developing away the photoresist that had been exposed to the radiation to form the void portion 75, and leaving intact the photoresist that had not been exposed to the radiation to form the etchant-blocking portion 74.

In FIG. 6 a first etching step is shown in which a directional etchant 72, such as a directional plasma generated by a reactive ion etch (RIE) process, is directed onto the exposed portion of the top surface 63 of the IR 64. The directional etchant 72 continues through the IR 64 and stops at the nitride blanket 60, etching away portions of the IR 64 exposed to the directional etchant 72, but not etching away any of the nitride blanket 60. A preferable RIE process includes the use of $C_2F_2$ at a pressure in a range of about 2 mtorr to about 20 mtorr and at a power between about 500 watts and about 2000 watts. The nitride blanket 60 will be etched away in a second etching step, as will be described infra in conjunction with FIG. 8. Note that, as an alternative to RIE, any applicable directional etching process known to one skill in the art may be used to etch away portions of the IR 64.

Figure 7:
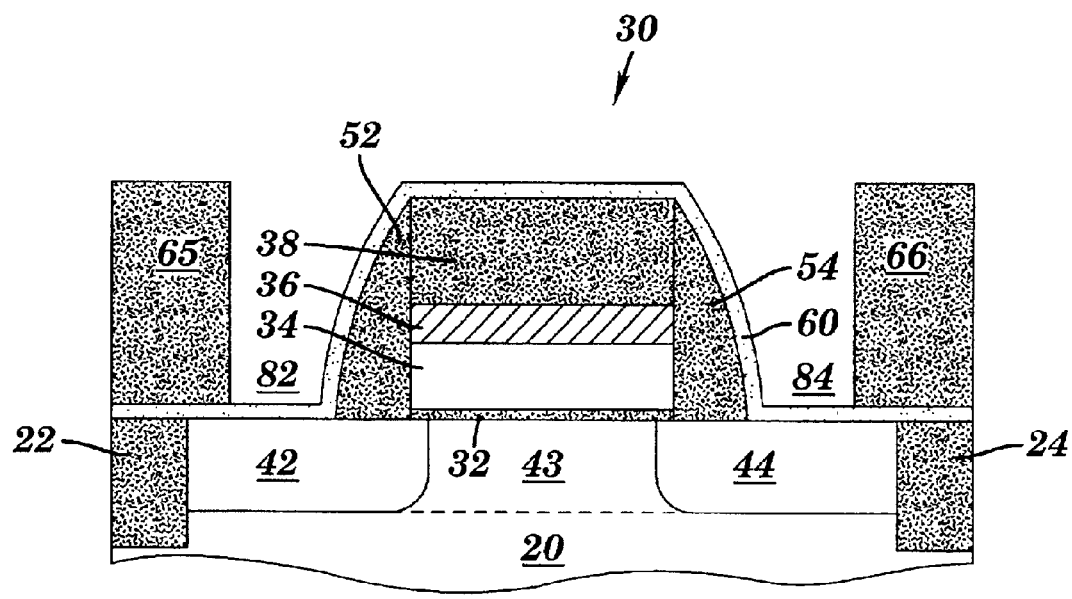
FIG. 7 depicts FIG. 6 after cavities have been formed in the portions of the IR that had been exposed to the directional etchant, while leaving the nitride blanket in place.

FIG. 7 illustrates FIG. 6 after the first etching step. In FIG. 7, cavities 82 and 84 have been formed in the IR 64 (see FIG. 6) by directionally etching away portions of the IR 64, such that IR regions 65 and 66 remain. As stated previously, the nitride blanket 60 is not etched by the photoetchant. Thus noting that material within the semiconductor substrate 20, the insulative spacer 52, and the insulative spacer 54 may be etched by the directional etchant, the nitride blanket 60 serves as an etch stop that protects the semiconductor substrate 20 and the insulative spacers 52 and 54 from being etched by the directional etchant.

FIG. 6 show the mask pattern 68 which enable portions of the IR 64 to be concurrently etched as explained supra, with consequent concurrent formation of the cavities 82 and 84 shown in FIG. 7. Nonetheless, other mask patterns may be used to facilitate formation of either cavity 82 and 84, but not both. With proper sequencing of such other photoresist patterns, the cavities 82 and 84 would be formed during distinct periods of time.

Figure 8:
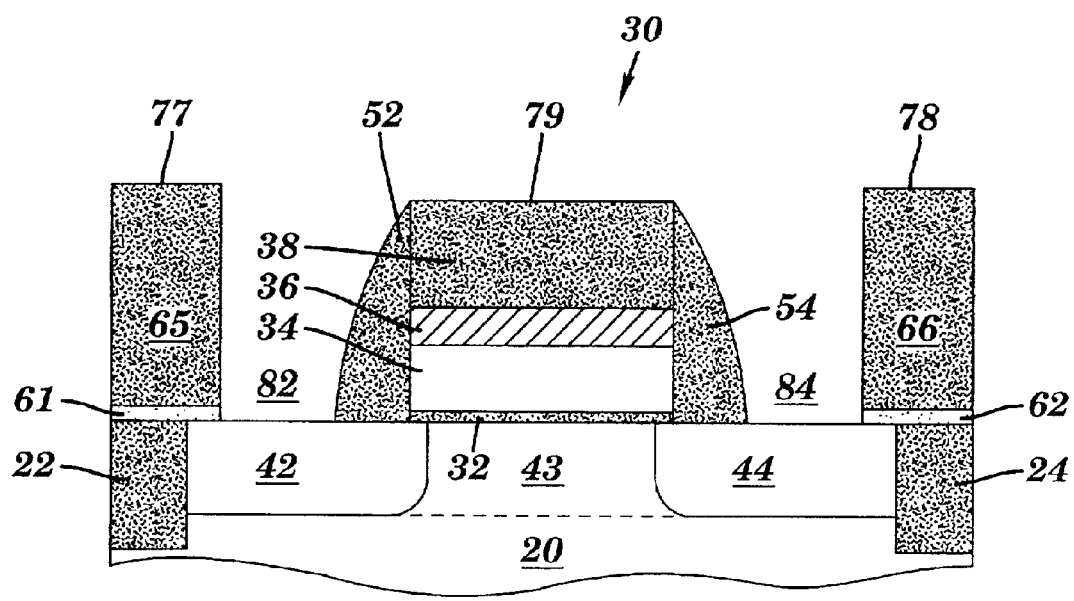
FIG. 8 depicts FIG. 7 after the nitride blanket has been etched away.

FIG. 8 illustrates FIG. 7 after the second etching step for etching the nitride blanket 60. In FIG. 8, exposed portions of the nitride blanket 60 have been removed by an etching process specific to a nitride, such as RIE using $CHF_3$ and $O_2$ in combination at a pressure in a range of about 50 mtorr to about 200 mtorr and at a power between about 50 watts and about 300 watts. Unexposed portions of the nitride blanket 60 have not been etched, leaving nitride layers 61 and 62 respectively positioned adjacent to the cavities 82 and 84, and under the IR regions 65 and 66.

FIG. 9 illustrates FIG. 8 after conductive material that includes a metal has filled the cavities 82 and 84 to respectively form conductive studs 92 and 94. Prior to filling the cavities 82 and 84 with conductive material, however, liner layers 86 and 87 have been respectively formed, such as by sputter depositing, on the exposed surfaces of the cavities 82 and 84, as well on the top surfaces 77, 78, and 79 (see FIG. 8) of the IR region 65, the IR region 66, and the insulative cap 38, respectively. The liner layers 86 and 87 of FIG. 9 provide a low-resistance contact to the drain region 42 and the source region 44, respectively. For some metal conductive materials such as copper, the liner layers 86 and 87 may also serve as a barrier to subsequent diffusion of the metal of the conductive material into the drain region 42 and the source region 44, respectively. The material of the liner layers may include, inter alia: titanium; a three layer composite of titanium nitride, titanium, and tungsten; or three layer composite of titanium nitride, titanium, and tantalum. A preferred liner material includes a combination of titanium and titanium nitride. After the liner layers 86 and 87 have been formed, such as by blanket sputter deposition, the cavities 82 and 84 may be filled with the conductive material by any method known to one of ordinary skill in the art, such as by chemical vapor deposition (CVD) followed by CMP to form a smooth top surface.

Since the conductive studs 92 and 94 are on opposite side of the gate structure 30, and do not extend over a top surface 31 of the gate structure 30, there is little risk of electrical shorting between the conductive studs 92 and 94. The cavities 82 and 84 may be filled with conductive material concurrently, during overlapping time periods, or during distinct time periods. The conductive studs 92 and 94 are self-aligned to the gate structure 30 and electrically contact the drain 42 and the source 44, respectively. Note that "electrical contact" (and variations thereof) includes electrically conductive contact. As a result of conductive material having filled the cavities 82 and 84, the conductive studs 92 and 94 each include a metal such as tungsten, copper, or aluminum. The metal in the cavity 82 and the metal in the cavity 84 may be the same metal or different metals. With the conductive studs 92 and 94 in place, FIG. 9 depicts a first contact layer 120 which includes the conductive stud 92, the conductive stud 94, and the gate structure 30. A smooth top surface 96 of the first contact layer 120 may be formed by any process known to one of ordinary skill in the art, such as by the process of CMP. As a result, a top surface 93 of the conductive stud 92, a top surface 95 of the conductive stud 94, and the top surface 31 of the gate structure 30 are coplanar with one another and coplanar with the top surface 96 of the first contact layer 120. This feature of coplanarity facilitates addition of a second contact layer 130 on the first contact layer 120, with consequent substantial flexibility in spatially positioning conductive contacts within the second contact layer 130, as discussed infra in conjunction with FIG. 10 and 11.

Figure 10:
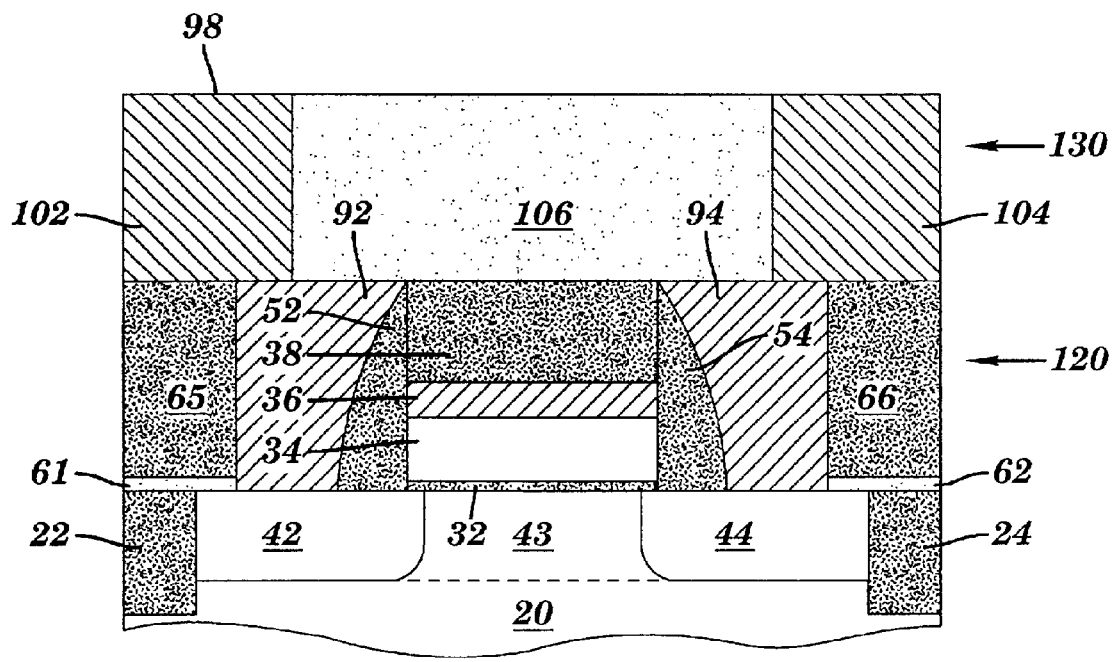
FIG. 10 depicts FIG. 9 after a layer that includes conductive posts has been formed over the conductive studs.

FIG. 10 illustrates FIG. 9 after the second contact layer 130 (also called an interlevel layer) has been formed over the first electrical contact layer 120. The second contact layer 130 includes conductive posts 102 and 104, and an interlevel dielectric (ILD) 106 disposed between conductive posts 102 and 104. The conductive posts 102 and 104 conductively contact the conductive studs 92 and 94, respectively. The conductive posts 102 and 104 each include a conductive metal such as tungsten, copper, or aluminum. The second contact layer 130 may be formed by: forming the ILD 106 over the first contact layer 120, forming two cavities through a total thickness of the ILD 106 such that the cavities respectively contact the conductive studs 92 and 94, and filling the cavities with the conductive metal to form the conductive posts 102 and 104. The two cavities may be formed by any method known to one of ordinary skill in the art, such as by the method of reactive ion etch (RIE). A smooth top surface 98 of the second contact layer 130 may be formed by any process known to one of ordinary skill in the art, such as by the process of CMP. Note that the liner layers 86 and 87 shown in FIG. 9 as circumscribing the conductive studs 92 and 94, respectively, are present in relation to FIG. 10 even though the liner layers 86 and 87 are not explicitly shown in FIG. 10. Similarly, the conductive posts 102 and 104 have liner layers analogous to the liner layers 86 and 87 shown in FIG. 9.

Similarly, a third contact layer may be formed, wherein the third contact layer includes two metallic contacts that are conductively coupled to the conductive posts 102 and 104, respectively. Any finite number of stacked contact levels may be formed in the foregoing manner.

Figure 11:
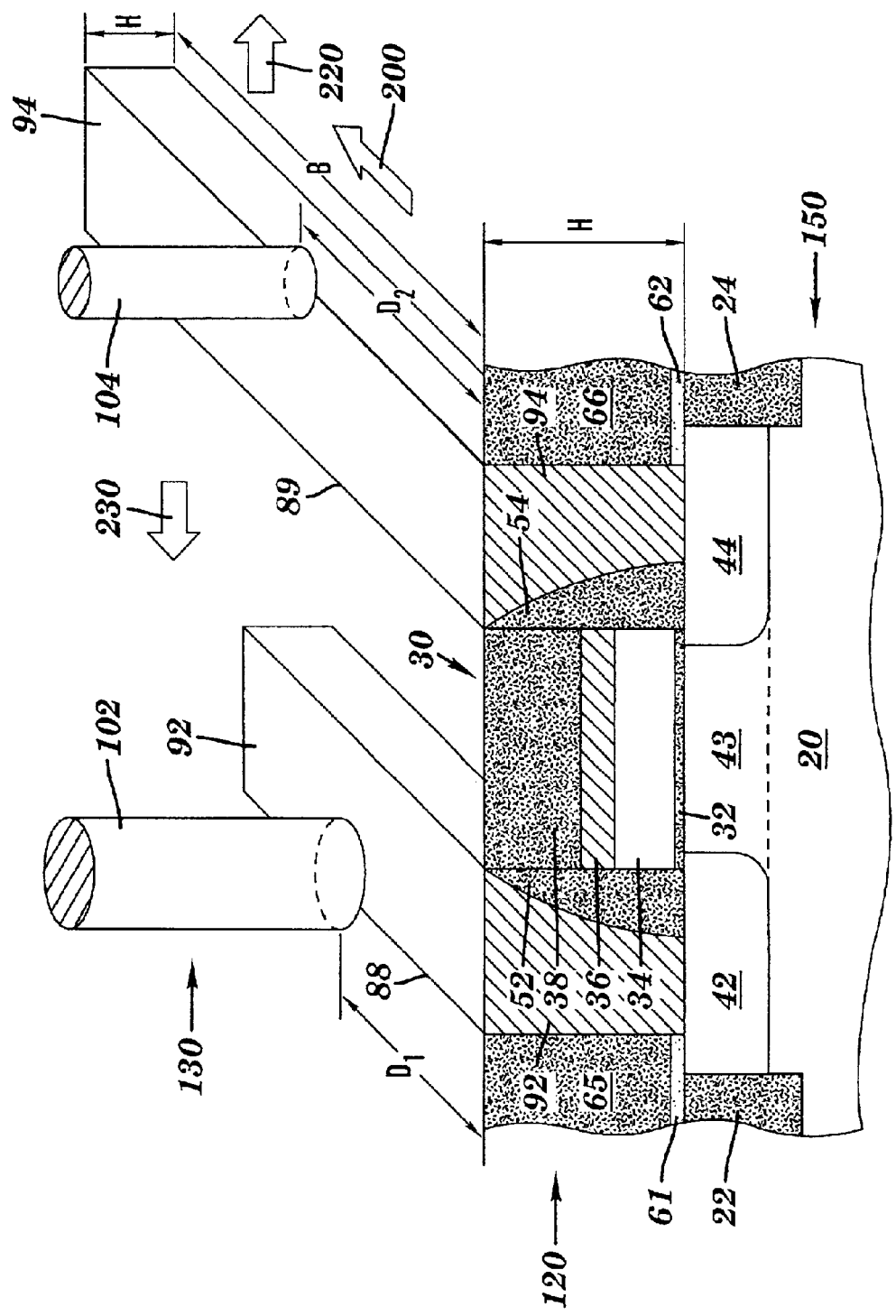
FIG. 11 depicts FIG. 10 perspectively showing the conductive studs and conductive posts in three dimensions.

FIG. 11 illustrates FIG. 10, perspectively showing a conductive structure in three dimensions, wherein the conductive structure includes: the conductive stud 92, the conductive stud 94, the conductive post 102, and the conductive 104. Other portions of FIG. 10 have three-dimensional structure that is not shown in FIG. 11. In particular, FIG. 11 shows the conductive structure extending backward in the direction 200, wherein the direction 200 is normal to the cross-sectional plane 150. The conductive post 102 conductively sits on the conductive stud 92 at a distance $D_1$ (in the direction 200) from the cross-sectional plane 150. The conductive post 104 conductively sits on the conductive stud 94 at a distance $D_2$ (in the direction 200) from the cross-sectional plane 150. The distances $D_1$ and $D_2$ are each arbitrary and independent of each other. Additionally, the conductive studs 92 and 94 may each have any desired conductive path within the height range H of the first electrical contact layer 120. For example, the conductive stud 94 may extend backward any desired distance B in the direction 200, and then turn ninety degrees in the direction 220, wherein the direction 220 is perpendicular to the direction 200. The conductive posts 102 and 104 may be placed wherever desired on the conductive studs 92 and 94, respectively, as denoted by the distances $D_1$ and $D_2$. Accordingly, there is substantial flexibility as to where the conductive posts 102 and 104 may be placed within the second electrical contact layer 130 (see FIG. 10). Thus, the present invention permits formation of a large variety of conductive pathways to the drain 42 and the source 44, wherein a conductive pathway includes, inter alia, the conductive stud 92 combined with the conductive post 102 and any other conductive structure coupled to the conductive post 102. As another example, the conductive pathway may include the conductive stud 94 combined with the conductive post 104 and any other conductive structure coupled to the conductive post 104. Also note that the conductive posts 102 and 104 may be moved laterally (i.e., in the direction 220 or the direction 230), so long as the conductive posts 102 and 104 remain in conductive contact with the conductive studs 92 and 94, respectively. For example, the conductive post 104 may be moved in the direction 230 so as to overlap the edge 89 of the conductive stud 94, in the same manner that the conductive post 102 overlaps the edge 88 of the conductive stud 92.

Figure 12:
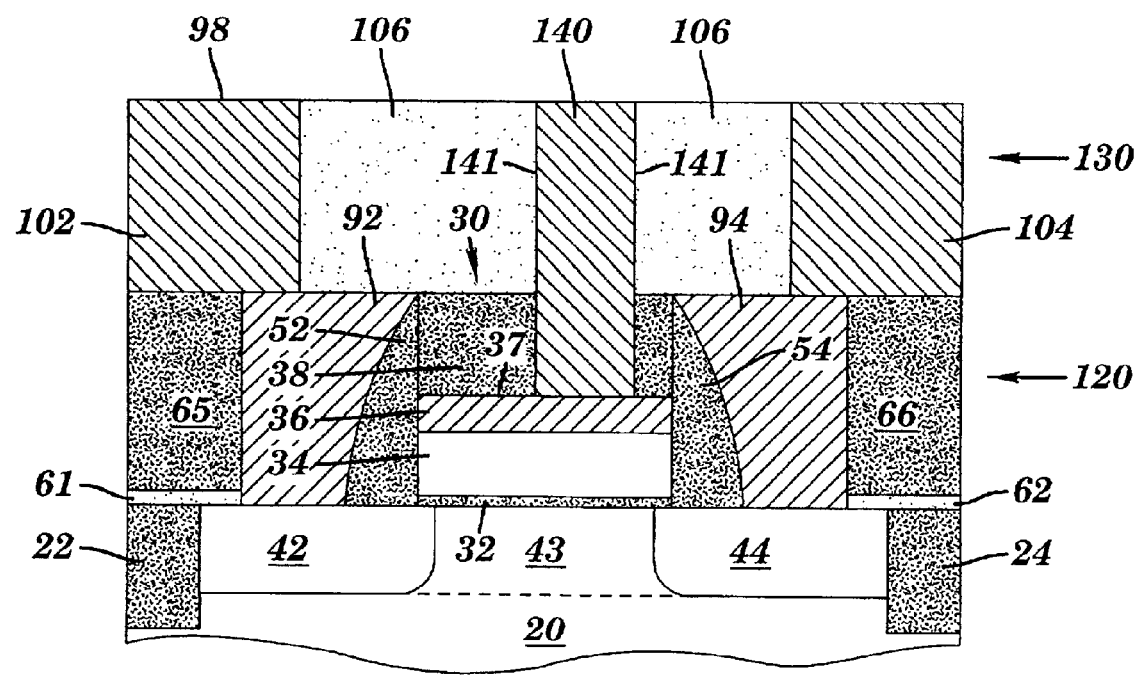
FIG. 12 depicts FIG. 10 after a conductive contact to conductive gate of the gate structure has been formed.

FIG. 12 illustrates FIG. 10 after a conductive contact 140 to the conductive gate 34 has been formed by: photoexposing and etching, such as by RIE, through the interlevel dielectric 106 and material above the interlevel dielectric 106 to form a cavity (bounded by the surface 141) on top of the gate structure 30, extending the cavity to the surface 37 of the silicide layer 36 by etching through the insulative cap 38, forming a conductive liner (not shown) in the cavity, and filling the cavity with conductive material to form the conductive contact 140. Noting that the silicide layer 36 is conductive, the conductive contact 140 is conductively coupled to the conductive gate 36.

It should be noted that process steps for forming the conductive posts 102 and 104 of FIGS. 10 and 11 may overlap with process steps for forming the conductive contact 140 of FIG. 12. While the required cavities (e.g., the cavity bounded by the surface 141 in FIG. 12, and the cavities into which metal will be deposited to form the conductive posts 102 and 104 in FIG. 10) would most likely be formed separately, the deposition of metal that fills said cavities can be performed in one process step. Additionally, formation of the top surface 98 of second electrical contact layer 130, such as by CMP, can be performed in one precess step.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for fabricating a semiconductor device, comprising the steps of:

providing a semiconductor substrate;

forming a gate structure, including:
  forming a gate dielectric on a surface of the semiconductor substrate;
  forming a conductive gate aligned on the gate dielectric;
  forming a silicide layer aligned on the conductive gate; and
  forming an insulative cap aligned on the silicide layer;

forming a drain region within the semiconductor substrate;

forming a source region within the semiconductor substrate, wherein a channel region is disposed between the drain region and the source region, and wherein the gate dielectric is over the channel region;

forming a first insulative spacer on a first sidewall of the gate structure;

forming a second insulative spacer on a second sidewall of the gate structure;

forming a first conductive stud in contact with the first insulative spacer, and in electrical contact with the drain region, wherein the first conductive stud includes a first conductive material; and forming, a second conductive stud in contact with the second insulative spacer, and in electrical contact with the source region, wherein the second conductive stud includes a second conductive material, and wherein a surface of the first conductive stud, a surface of the second conductive stud, and a surface of the gate structure are coplanar;

forming a conductive contact to the conductive gate, wherein the conductive contact passes through the insulative cap, and wherein the conductive contact is in direct mechanical and electrical contact with the silicide layer; and forming an interlevel layer above the insulative cap and in direct mechanical contact with the insulative cap, wherein the interlevel layer comprises an interlevel dielectric, and wherein the conductive contact passes through the interlevel layer, wherein the interlevel layer comprises a first conductive post conductively coupled to the first conductive stud and a second conductive post conductively coupled to the second conductive stud, wherein the entire first conductive post is displaced backwards by a distance $D_1$ relative to a front cross-sectional plane that perpendicularly cuts through the first and second conductive studs such that $D_1 > 0$ and $D_1$ is a minimum distance between the first conductive post and the front cross-sectional plane, and wherein the entire second conductive post is displaced backwards by a distance $D_2$ relative to the front cross-sectional plane such that $D_2>0$ and $D_2$ is a minimum distance between the second conductive post and the front cross-sectional plane.

2. The method of claim 1, wherein $D_1$ is unequal to $D_2$.

3. The method of claim 1, wherein the second conductive stud extends backwards by a distance B relative to the front cross-sectional plane such that $B>D_2$.

4. A method for fabricating a semiconductor device, comprising the steps of:
   providing a semiconductor substrate;
   forming a gate structure, including:
      forming a gate dielectric on a surface of the semiconductor substrate;
      forming a conductive gate aligned on the gate dielectric;
      forming a silicide layer aligned on the conductive gate; and
      forming an insulative cap aligned on the silicide layer;
   forming a drain region within the semiconductor substrate;
   forming a source region within the semiconductor substrate, wherein a channel region is disposed between the drain region and the source region, and wherein the gate dielectric is over the channel region;
   forming a first insulative spacer on a first sidewall of the gate structure;
   forming a second insulative spacer on a second sidewall of the gate structure;
   forming a first conductive stud in contact with the first insulative spacer, and in electrical contact with the drain region, wherein the first conductive stud includes a first conductive material; and forming a second conductive stud in contact with the second insulative spacer, and in electrical contact with the source region, wherein the second conductive stud includes a second conductive material, and wherein a surface of the first conductive stud, a surface of the second conductive stud, and a surface of the gate structure are coplanar; and
   forming a conductive contact to the conductive gate, wherein the conductive contact passes through the insulative cap, wherein the conductive contact is in direct mechanical and electrical contact with the silicide layer, wherein the first conductive material includes a first metal that is continuously distributed from a bottom surface of the first conductive stud to a top surface of the first conductive stud, wherein the second conductive material includes a second metal that is continuously distributed from a bottom surface of the second conductive stud to a top surface of the second conductive stud, and wherein and the second metal differs from the first metal.

5. The method of claim 4, wherein the conductive gate includes polysilicon.

6. The method of claim 4, wherein the conductive gate includes a metal.

7. The method of claim 4, wherein the conductive gate includes a metal alloy.

8. The method of claim 4, wherein the drain region comprises N+material, wherein the channel region comprises P−material, and wherein the source region comprises said N+material.

9. The method of claim 4, wherein the drain region comprises P+material, wherein the channel region comprises N−material, and wherein the source region comprises said P+material.

10. A method for fabricating a semiconductor device, comprising the steps of:
   providing a semiconductor substrate;
   forming a gate structure, including:
      forming a gate dielectric on a surface of the semiconductor substrate;
      forming a conductive gate aligned on the gate dielectric;
      forming a silicide layer aligned on the conductive gate; and
      forming an insulative cap aligned on the silicide layer;
   forming a drain region within the semiconductor substrate;
   forming a source region within the semiconductor substrate, wherein a channel region is disposed between the drain region and the source region, and wherein the gate dielectric is over the channel region;
   forming a first insulative spacer on a first sidewall of the gate structure;
   forming a second insulative spacer on a second sidewall of the gate structure;
   forming a first conductive stud in contact with the first insulative spacer, and in electrical contact with the drain region, wherein the first conductive stud includes a first conductive material; and
   forming a second conductive stud in contact with the second insulative spacer, and in electrical contact with the source region, wherein the second conductive stud includes a second conductive material, and wherein a surface of the first conductive stud, a surface of the second conductive stud, and a surface of the gate structure are coplanar;
   forming a conductive contact to the conductive gate, wherein the conductive contact passes through the insulative cap, and wherein the conductive contact is in direct mechanical and electrical contact with the silicide layer; and
   forming an interlevel layer above the insulative cap, wherein the conductive contact passes through the interlevel layer, wherein the interlevel layer comprises an interlevel dielectric material, wherein a continuously distributed portion of the interlevel dielectric material is in direct mechanical contact with the insulative cap at a surface of the insulative cap and with the first conductive stud at the surface of the first conductive stud, and wherein the surface of the insulative cap and the surface of the first conductive stud are coplanar.

* * * * *